(12) United States Patent
Beutel et al.

(10) Patent No.: US 8,607,429 B2
(45) Date of Patent: Dec. 17, 2013

(54) CIRCUIT CARD ASSEMBLY EXTRACTION TOOL AND METHODS THEREOF

(75) Inventors: Kurt M. Beutel, Tucson, AZ (US); Jeffery Thomas Anderson, Tucson, AZ (US); David C. Penny, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 644 days.

(21) Appl. No.: 12/703,536

(22) Filed: Feb. 10, 2010

(65) Prior Publication Data

US 2011/0005053 A1   Jan. 13, 2011

Related U.S. Application Data

(60) Provisional application No. 61/225,081, filed on Jul. 13, 2009.

(51) Int. Cl.
*B23P 19/00* (2006.01)

(52) U.S. Cl.
USPC ............. 29/426.5; 29/426.1; 29/263; 29/264; 29/265; 29/764

(58) Field of Classification Search
USPC ............. 29/426.5, 426.1, 263–265, 762, 764
See application file for complete search history.

(56) References Cited

U.S. PATENT DOCUMENTS

| 5,276,951 A | * | 1/1994 | Gluszek | .......................... 29/265 |
| 6,067,705 A | | 5/2000 | Boyde et al. | |
| 2003/0229985 A1 | | 12/2003 | Kappel et al. | |

FOREIGN PATENT DOCUMENTS

| DE | 7204444 U | 4/1977 |
| JP | 58021816 A | 2/1983 |

OTHER PUBLICATIONS

International Searching Authority, European Patent Office, "International Search Report," mailed Jul. 9, 2010; International Application No. PCT/US2010/028160, filed Mar. 22, 2010.

* cited by examiner

*Primary Examiner* — Peter DungBa Vo
*Assistant Examiner* — Azm Parvez
(74) *Attorney, Agent, or Firm* — Thorpe North & Western LLP

(57) ABSTRACT

An extraction tool is provided for grasping an assembly (e.g., a circuit card assembly) having a number of openings and a number of respective connector pins extending through the openings. The tool includes one or more generally cylindrical puller structures, each having a central bore and a locking end. One or more filler rods are configured to translate coaxially within the central bore of their corresponding puller structure. The filler rod has a central bore configured to accept one of the connector pins. The puller structure is configured to extend through one of the openings such that the locking end engages the opposite side of the assembly. The filler rod is configured to translate within the puller structure, and around a connector pin extending through the selected opening, to apply outward radial pressure on the locking ends of the puller structure.

19 Claims, 5 Drawing Sheets

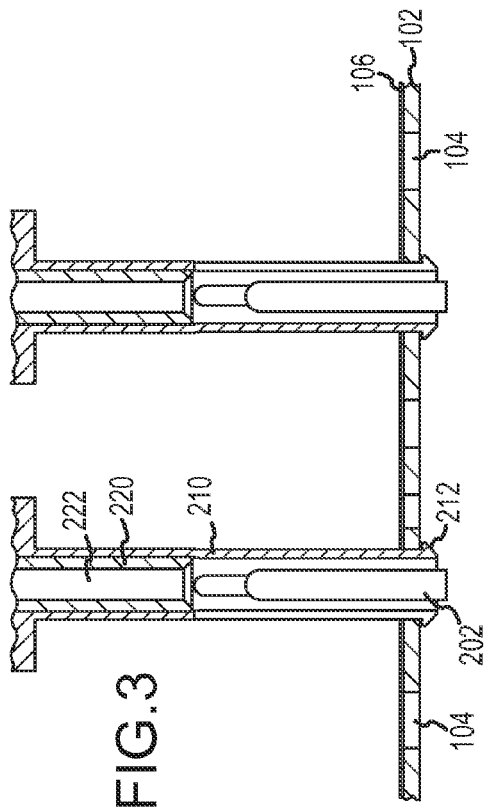
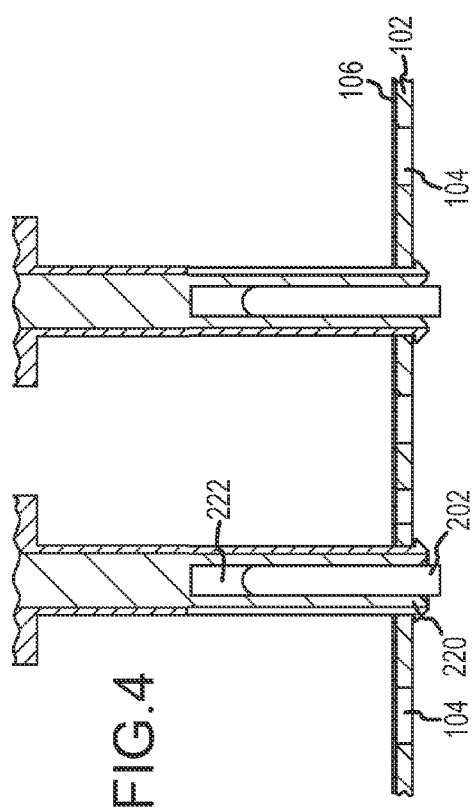
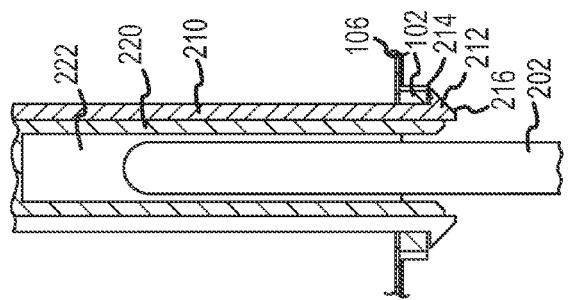

CIRCUIT CARD ASSEMBLY EXTRACTION TOOL AND METHODS THEREOF

CROSS-REFERENCE TO RELATED APPLICATIONS

This application claims priority to U.S. Prov. Pat. App. No. 61/225,081, filed Jul. 13, 2009, which is hereby incorporated by reference.

GOVERNMENT RIGHTS

This invention was made with United States Government support under Contract number No 0019-04-C-0569. The United States Government has certain rights in this invention.

TECHNICAL FIELD

The present invention generally relates to the removal of perforated structures such as circuit card assemblies (CCAs) from housings and other structures.

BACKGROUND

Certain structures, including various missile systems, may include one or more circuit card assemblies (CCAs) disposed within a mated connector pair to effect connection between one or more of the electronic subsystems. The CCA, which is typically a perforated structure through which multiple connector pins are inserted, thereby providing electrical connectivity as desired.

In the interest of re-use, it is often desirable to remove such CCAs from a structure. However, removal can be complicated by various factors, including the presence of easily-damaged connector pins and soft copper plated contact tabs that press against the connector pins for electrical connection.

Known methods of removing such connectors include, for example, dental picks and double-sided tape, both of which are unreliable, cumbersome, time-consuming, and otherwise unsatisfactory.

Accordingly, it is desirable to provide simple and repeatable methods for removing connector assemblies from their surrounding structure. Other desirable features and characteristics of the present invention will become apparent from the subsequent detailed description and the appended claims, taken in conjunction with the accompanying drawings and the foregoing technical field and background.

BRIEF SUMMARY

In accordance with one embodiment, an extraction tool is configured to grasp an assembly (e.g., a circuit card assembly) of the type having a number of openings and a number of respective connector pins extending through the openings. The tool includes one or more generally cylindrical puller structures, each having a central bore and a locking end. A filler rod translates coaxially within the central bore of the puller structure. The filler rod has a central bore configured to accept one of the connector pins. The puller structure is configured to extend through one of the openings such that the locking end engages the opposite side of the assembly. The filler rod is configured to translate within the puller structure, and around a connector pin extending through the selected opening, to apply outward radial pressure on the locking ends of the puller structure.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

FIG. 2 is a close-up partial cross-section of one aspect of an extraction tool in accordance with one embodiment;

FIGS. 3 and 4 depict operation of the extraction tool depicted in FIG. 2;

DETAILED DESCRIPTION

The following detailed description is merely illustrative in nature and is not intended to limit the invention or the application and uses of the invention. Furthermore, there is no intention to be bound by any expressed or implied theory presented in the preceding technical field, background, brief summary or the following detailed description. For the purposes of conciseness, many conventional techniques and principles related to circuit cards, connectors, and the like are not described in detail herein.

In general, the present subject matter relates to an extraction tool configured to grasp an assembly (e.g., a circuit card assembly) of the type having a number of openings and a number of connector pins extending therethrough, wherein the pins are mechanically coupled in some way to the card assembly—for example, via contact tabs that press against the sides of connector pins.

The extraction tool, as described in detail below, includes one or more generally cylindrical puller structures, each having a central bore and a locking end. A filler rod translates coaxially within the central bore of the puller structure and has a central bore configured to accept one of the connector pins. The puller structure is configured to extend through one of the openings such that the locking end engages the opposite side of the assembly. Subsequently, the filler rod translates within the puller structure, and around a connector pin extending through the selected opening, to apply outward radial pressure on the locking ends of the puller structure. In this way, the extraction tool allows an operator to grab a circuit card assembly quickly and without damaging the associated connector pins.

Figure 1:
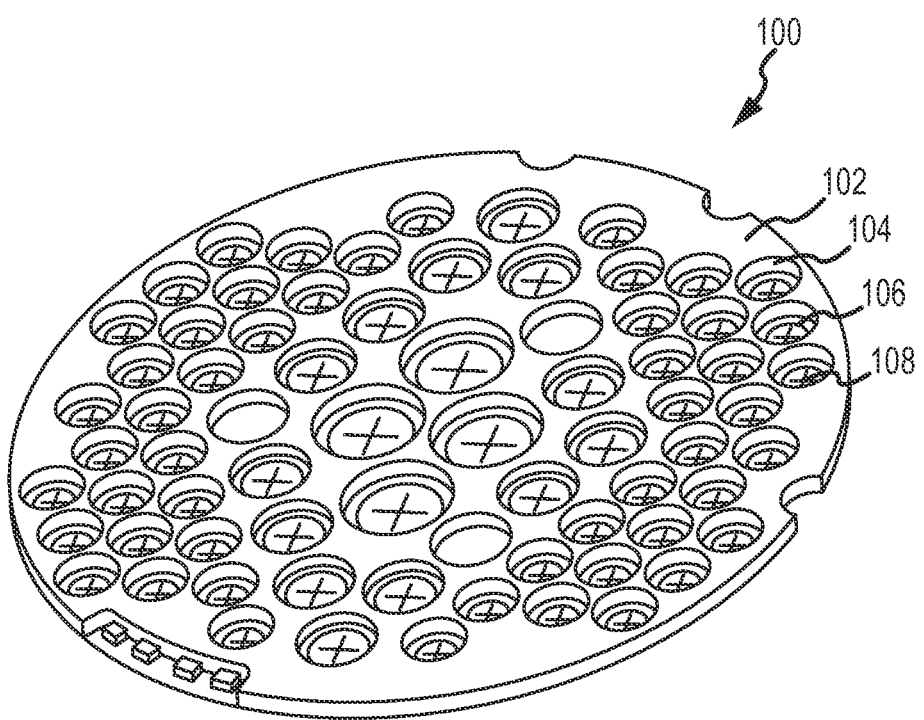
FIG. 1 depicts an exemplary circuit card assembly useful in describing operation of extraction tools in accordance with various embodiments.

FIG. 1 depicts an example perforated structure—in this case, a circuit card assembly (or "CCA") 100—useful in describing various embodiments. As shown CCA generally includes a guide structure 102 (e.g., a fiberglass disc) having a number of openings (e.g., circular openings) 104. Attached to guide structure 102 is some form of conductive, flexible layer 106 having openings 108 (in this embodiment, cross-shaped incisions) that are configured to press against the sides of connector pins that extend therethrough (not shown in FIG. 1. Although not shown in FIG. 1, CCA 100 may also be secured to an interfacial seal or other layer to protect internal components. As CCA 100 can be held quite tightly to the connector pins by layer 106, the task then becomes removing CCA from the pins in a manner that does not significantly damage the pins.

Referring now to the partial cross-sectional views of FIGS. 2-4, an extraction tool in accordance with various embodiments includes one or more generally cylindrical puller structures 210, each having a central bore and a locking end 212. A filler rod 220 is configured to translate coaxially within the central bore of puller structure 210 (i.e., up and down with respect to the figures).

Filler rod 220 itself has a central bore 222 configured to accept one of the connector pins 202. That is, bore 222 has a diameter that is slightly larger than that of connector pin 202 within some acceptable tolerance.

Puller structure 210 is configured to extend through one of the openings within guide 102 such that the locking end 212 engages the assembly—i.e., by contacting one side of the assembly. Filler rod 220 is configured to translate within puller structure 210 such that connector pin 202 slides within bore 222 and filler rod 220 applies outward radial pressure on the locking ends 212 of puller structure 210.

Operation is generally shown in FIG. 3, which depicts puller structure 210 engaging guide 102 (after being inserted therethrough), but with filler rod 220 undeployed. In FIG. 4, filler rod 220 has been subsequently moved downward over pin 202, thereby providing radial support for locking ends 212.

Figure 7:
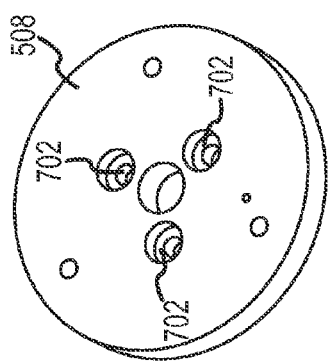
FIG. 7 is an isometric view of a filler guide as shown in FIG. 5.
Figure 6:
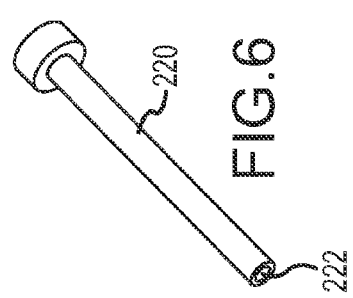
FIG. 6 is an isometric view of a filler rod as shown in FIG. 5.
Figure 5:
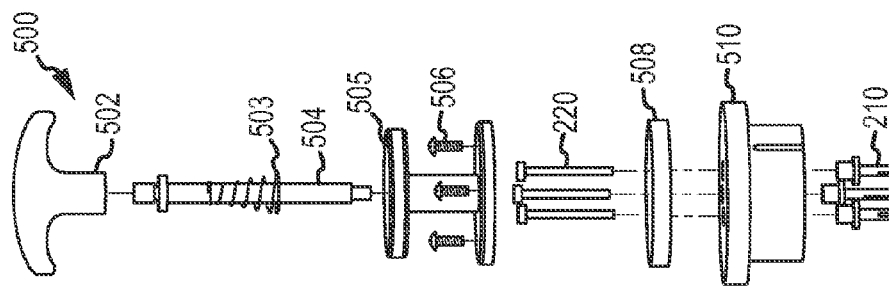
FIG. 5 is an exploded view of an exemplary extraction tool.

FIG. 5 depicts an exploded view of an extraction tool in accordance with a particular embodiment. As shown, a handle or other manipulatable component 502 is coupled to a central rod 504 that is slideably accepted by support structure 505, and is spring loaded with respect to structure 505 via spring 503. Filler rods 220 are secured to support structure 505 via filler guide 508 (and fit through openings 702 as shown in FIG. 7) which is fastened to support structure 505 via suitable fasteners 506. As shown in FIG. 6, filler rod 220 includes a central boor 222 configured to accept a connector pin (not shown) during operation.

Figure 9:
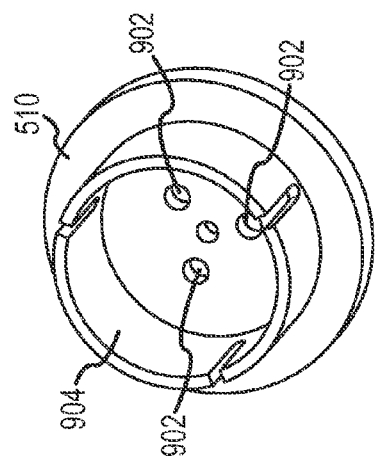
FIG. 9 is an isometric view of a puller guide as shown in FIG. 5.
Figure 8:
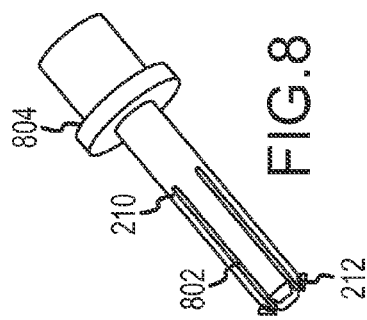
FIG. 8 is an isometric view of a puller structure as shown in FIG. 5.

Puller structures 210 are secured to puller guide 510 (e.g., via openings 902 illustrated in FIG. 9). In the particular embodiment, referring briefly to FIG. 8, puller structure 210 includes a number (e.g., four) tines or other elongated, flexible structures, and a shoulder 804, which sits flat against 510 on the opposite side of openings 702. Openings 702 are intended to house the "head" of the filler rods 220 such that filler guide 508 sits flat against support structure 505.

Figure 11:
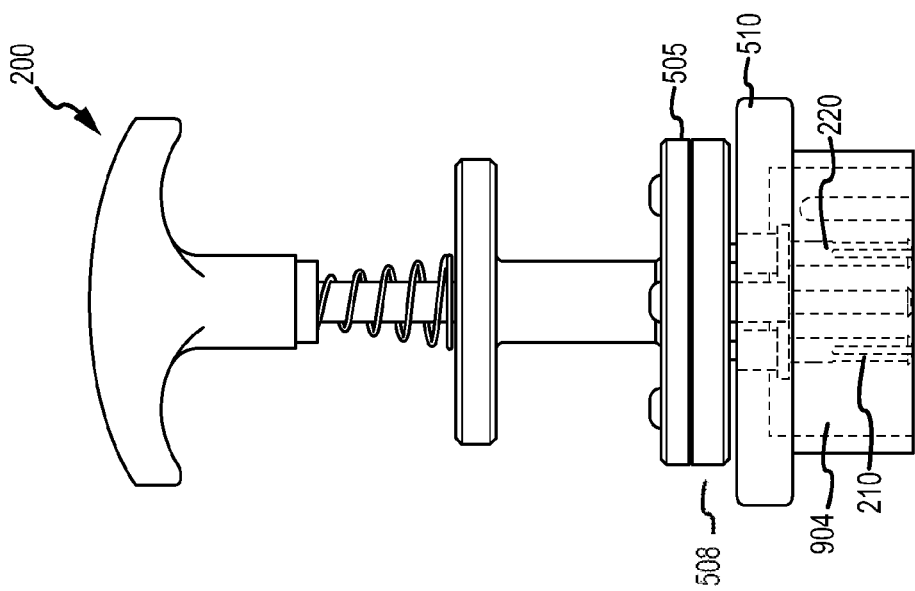
FIGS. 10, 11, and 12 depict operation of an extraction tool in accordance with one embodiment.
Figure 10:
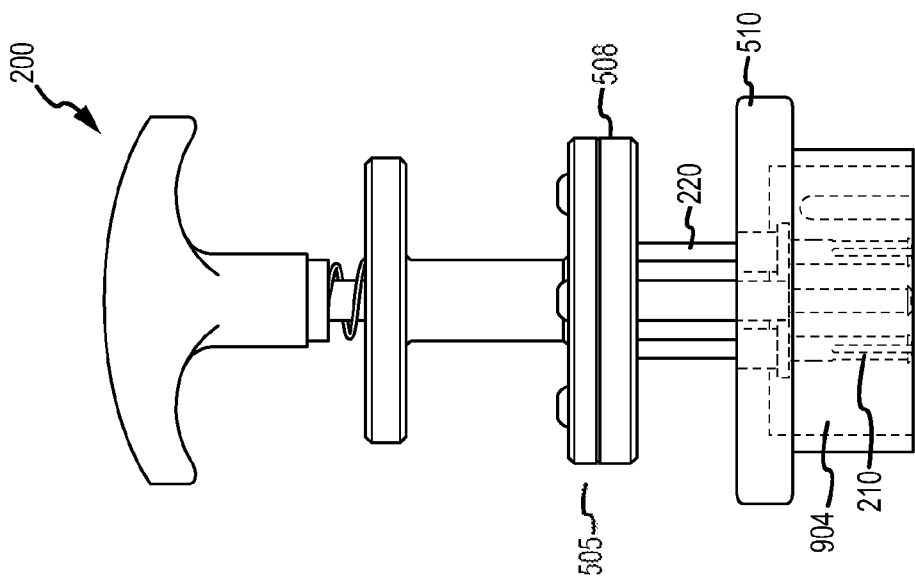

FIGS. 10 and 11 show operation of an extraction tool 200 in accordance with the embodiment depicted in FIG. 5. In FIG. 10, filler rods 220 are shown retracted from puller structures 210. This is the state of tool 200 before puller structures 210 have been inserted within the assembly to be removed (not illustrated). Support structure has been translated upward toward handle 502.

In FIG. 11, support structure 505 has been allowed to translate downward toward puller guide 510 immediately after puller structures 210 have been inserted within the assembly to be removed (not illustrated). such that filler rods 220 translate coaxially within puller structures 210, thereby providing axial support for the locking ends (not shown) of puller structures 210.

When the locking ends 212 of the extraction tool bearing the tines 802 come in contact with CCA 100, the tines deflect toward the longitudinal axis to fit through a hole or perforation in CCA 100. Once through the hole, the tines of the extraction tool are expanded, via filler rod 220, which translates axially therethrough, such that the tines expand to the original diameter. With the tines thus expanded, the entire assembly can then be pulled away from its surrounding structure. The CCA is, in this way, held in the connector via a significant retention force. The robust tines combined with the filler rod are capable of resisting the retention force and securely hold the CCA so that it can be removed without damaging the connector.

Figure 12:
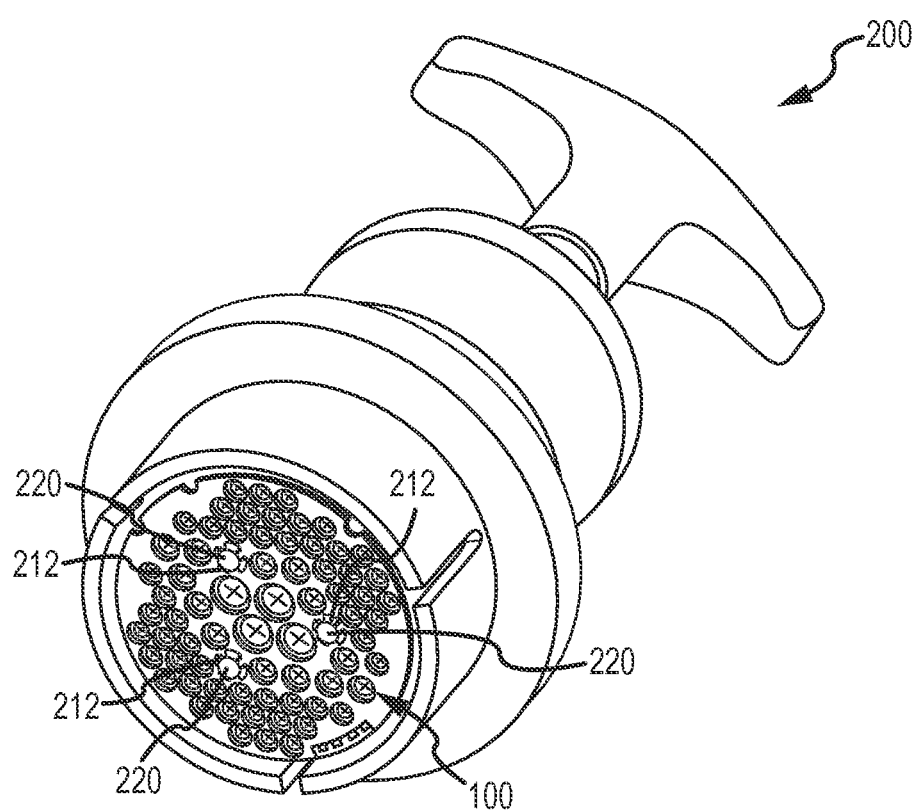

FIG. 12, for example, shows a typical CCA 100 after having been extracted in this manner. As shown, locking ends 212 securely grasp CCA 100 by virtue of filler rods 220. Note also that, in this embodiment, CCA 100 fits within a cylindrical cavity in puller guide 510 (shown as cavity 904 in FIG. 10).

In accordance with one embodiment, the grabbers interlock with three holes 104 in CCA 100 that are used to align the two pieces of the insert; however, the embodiments are not so limited, and comprehend any particular number of holes and hole configurations.

The components of extraction tool 500 may any suitable metal, plastic, or composite material. In a preferred embodiment, the tines of puller structure 210 are metal, for example, A286 or UNS S66286 steel. The use of a metallic material increases the rigidity and robustness of the tool.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient and edifying road map for implementing the described embodiment or embodiments. It should be understood that various changes can be made in the function and arrangement of elements without departing from the scope of the invention and the legal equivalents thereof.

The invention claimed is:

1. An extraction tool for attaching to an assembly having a plurality of openings and a plurality of respective connector pins extending therethrough, the extraction tool comprising:
    a puller guide;
    one or more generally cylindrical puller structures having a first central bore and a locking end, wherein the one or more puller structures is secured to the puller guide, the puller guide facilitating alignment of the extraction tool relative to the assembly;
    one or more filler rods configured to translate coaxially within the first central bore of a corresponding puller structure, the filler rod having a second central bore configured to accept one of the connector pins;
    wherein the puller structure is configured to extend through a selected one of the openings such that the locking end engages a first side of the assembly; and
    wherein the filler rod is configured to translate within the puller structure, and around a connector pin extending through the selected opening, to apply outward radial pressure on the locking ends of the puller structure; and
    wherein the puller guide is movable with the assembly to minimize damage to the connector pin during extraction of the assembly.

2. The extraction tool of claim 1, wherein the filler rod is configured to extend such that a portion of the filler rod is adjacent to the locking end of the puller structure.

3. The extraction tool of claim 1, wherein the puller structure comprises a plurality of flexible tines.

4. The extraction tool of claim 1, wherein the locking end includes a plurality of generally wedge-shaped structures having a surface configured to contact a side of the assembly when the puller structure extends through the selected opening.

5. The extraction tool of claim 1, wherein the one or more puller structure comprises three equidistantly positioned puller structures.

6. The extraction tool of claim 5, further including a handle coupled to the filler rods, wherein the handle is spring loaded with respect to the puller structures.

7. A method of extracting a card assembly comprising a plurality of openings from a plurality of respective connector pins extending therethrough, the method comprising:
   providing a generally cylindrical puller structures having a first central bore and a locking end; wherein the one or more puller structures is secured to the puller guide, the puller guide facilitating alignment of the extraction tool relative to the assembly;
   providing a filler rod configured to translate coaxially within the first central bore of a corresponding puller structure, the filler rod having a second central bore configured to accept one of the connector pins;
   inserting the puller structure through a selected one of the openings such that the locking end engages a first side of the assembly;
   sliding the filler rod within the puller structure, toward the card assembly and around a connector pin extending through the selected opening, to apply outward radial pressure on the locking ends of the puller structure; and
   extracting the card assembly in a direction parallel to the axis of the puller structure, wherein the puller guide is movable with the assembly to minimize damage to the connector pin during extraction of the assembly.

8. The method of claim 7, including extending the filler rod such that a portion of the filler rod is adjacent to the locking end of the puller structure.

9. The method of claim 7, wherein the puller structure comprises a plurality of flexible tines.

10. The method of claim 7, wherein the locking end includes a plurality of generally wedge-shaped structures having a surface configured to contact a side of the assembly when the puller structure extends through the selected opening.

11. The method of claim 10, wherein the one or more puller structure comprises three equidistantly positioned puller structures.

12. The method of claim 7, further including providing a handle coupled to the filler rods, wherein the extracting step includes translating the handle with respect to the puller structures.

13. An extraction tool for grasping a card assembly having a plurality of openings and a plurality of respective connector pins extending therethrough that are mechanically coupled to the card assembly, the extraction tool comprising:
   a puller guide;
   a plurality of generally cylindrical puller structures, each having a first central bore and a set of tines terminated with respective locking ends, wherein the plurality of puller structures are secured to the puller guide, the puller guide facilitating alignment of the extraction tool relative to the assembly;
   a plurality of filler rods, each configured to translate coaxially within the first central bore of a corresponding puller structure, the filler rod having a second central bore configured to accept one of the connector pins;
   wherein the puller structure is configured to extend through a selected one of the openings such that the locking ends flex radially inward when passing through the selected opening, then engage a first side of the card assembly when extended through the opening; and
   wherein the filler rod is configured to translate within the puller structure, and around a connector pin extending through the selected opening, to apply outward radial pressure on the locking ends of the puller structure.

14. The extraction tool of claim 13, wherein the filler rod is configured to extend such that a portion of the filler rod is adjacent to the locking end of the puller structure.

15. The extraction tool of claim 13, wherein the locking ends include a plurality of generally wedge-shaped structures having a surface configured to contact a side of the assembly when the puller structure extends through the selected opening.

16. The extraction tool of claim 13, wherein the puller structures comprise three equidistantly positioned puller structures.

17. The extraction tool of claim 5, further including a handle coupled to the filler rods, wherein the handle is spring loaded with respect to the puller structures.

18. The extraction tool of claim 13, further including a filler guide configured to prevent radial movement of the filler rods.

19. The extraction tool of claim 13, wherein the puller guide includes a cavity configured to accept the card assembly after extraction.

* * * * *